United States Patent
Lasne

Patent Number: 5,850,403
Date of Patent: Dec. 15, 1998

[54] PROCESS OF SELECTIVELY PROTECTING INFORMATION BITS AGAINST TRANSMISSION ERRORS

[75] Inventor: Xavier Lasne, Beynes, France

[73] Assignee: Matra Communication, Quimper Cedex, France

[21] Appl. No.: 745,554

[22] Filed: Nov. 12, 1996

[30] Foreign Application Priority Data

Nov. 14, 1995 [FR] France .................................. 95 13471

[51] Int. Cl.⁶ ................................................. H03M 13/00
[52] U.S. Cl. .................... 371/37.4; 371/37.04; 371/40.3; 371/20.4; 371/43.5
[58] Field of Search .............................. 371/37.4, 37.04, 371/37.08, 37.5, 37.7, 37.02, 40.3, 42, 20.4, 32, 43.4, 43.5, 37.12

[56] References Cited

U.S. PATENT DOCUMENTS

| | | | |
|---|---|---|---|
| 5,159,610 | 10/1992 | Eyuboglu et al. | 375/18 |
| 5,214,672 | 5/1993 | Eyuboglu et al. | 375/34 |
| 5,563,897 | 10/1996 | Pyndiah et al. | 371/37.4 |

FOREIGN PATENT DOCUMENTS

| | | |
|---|---|---|
| 0 205 667 | 12/1986 | European Pat. Off. . |
| 0 490 552 | 6/1992 | European Pat. Off. . |
| 0 634 840 | 1/1995 | European Pat. Off. . |
| 2 714 555 | 6/1995 | France . |
| 89 09965 | 10/1989 | WIPO . |

OTHER PUBLICATIONS

IEE Proceedings–I. Solid–State & Electron Devices, vol. 140, n°2 Part I, Apr. 1993—"Error control for low–bit–rate speech communication systems"—Atungsiri S.A. et al—pp. 97–103.

Primary Examiner—Reba I. Elmore
Assistant Examiner—McDievnel Marc
Attorney, Agent, or Firm—Evenson, McKeown, Edwards & Lenahan, P.L.L.C.

[57] ABSTRACT

Based on the sequence of the information bits to be transmitted, the coder forms a second sequence of bits $c_n$, which includes a redundant subset. A differential coding of the form $d_n = c_n \oplus d_{f(n)}$ with $f(n) < n$ produces a third sequence of bits $d_n$. The signal sent represents the bits of the third sequence in a specified order. Having obtained likelihood data $r_n$ associated with the bits $d_n$, the receiver calculates estimates of the bits $c_n$ of the redundant subset as a function of the sign of $r_n \cdot r_{f(n)}$. By exploiting the redundancy, the receiver can detect the bits $c_n$ of the subset having erroneous estimates, and rectify the sign of the less reliable of the two associated likelihood data items $r_n$ and $r_{f(n)}$. The other bits $c_{n'}$ of the second sequence then benefit from additional protection if there is at least one bit $c_n$ of the redundant subset such that $n' = f(n)$ or $f(n') = n$ or $f(n)$.

16 Claims, 4 Drawing Sheets

PROCESS OF SELECTIVELY PROTECTING INFORMATION BITS AGAINST TRANSMISSION ERRORS

BACKGROUND OF THE INVENTION

The present invention relates to the field of the transmission of binary information, and more particularly to processes making it possible to protect some at least of the bits to be transmitted with regard to errors liable to be introduced by a transmission channel.

Here, "transmission channel" is understood to mean any path followed by a signal carrying information bits between a sender-device and a receiver device. Transmission channels thus include radio, wire or other links set up between the sender device and the receiver device, and also, in storage applications, channels including a memory in which the information delivered by the sender device is stored while waiting to be read by a receiver device.

The techniques of channel coding have been developed so as to afford some immunity with regard to errors resulting from the transmission channel. In particular, techniques of corrective coding using redundancy are widely employed to detect and/or correct errors. These techniques comprise convolutional codings and block codings. The principle of a redundant coder is to deliver n bits characterizing k information bits to be transmitted, with n>k. The ratio k/n defines the efficiency of the code, which should not be too low so as not to be penalizing in terms of required bandwidth. In order to enhance the correction capabilities of a code of given efficiency, recourse is customarily had to coders and especially to decoders which are substantially more complex (increased constraint length in the case of a convolutional code, or increased block length in the case of a block code).

Certain channel coders afford several classes of protection for the bits of a frame. Each protection class corresponds to the application of a corrector code of efficiency less than 1, with correction capabilities which differ from one code to the other. This makes it possible to distribute the bits of the frame between the classes based on their importance and to obtain protection dependent on the importance of the bits.

The error correcting codes using redundancy provide the best results when the error probabilities are uncorrelated from one symbol to the next. This condition of uncorrelation is satisfied in the case of a channel with additive white Gaussian noise, which, in practice, is often encountered to a good approximation. However, there are cases in which the condition of uncorrelation is not satisfied, especially in the case of radio links over a Rayleigh channel. A mobile radio terminal, as it moves around, may experience deep fades in which it receives several mutually phase-shifted versions of the same signal received along different propagation paths and which interfere destructively. Such fades may extend over several symbols and therefore impair the performance of the corrector code. In order to combat this phenomenon, most mobile radio systems make use of an interleaving which consists in permuting the symbols of one or more successive frames so as to better satisfy the uncorrelation condition for the probabilities of error in the symbols of the code words.

For certain radio transmission systems, the bits obtained after redundancy coding and if appropriate interleaving, are differentially encoded before being sent. This differential coding consists in transmitting the difference between two successive bits rather than the bits themselves. If $B_0, B_1, \ldots, B_{N-1}$ denote the frame of N bits to be transmitted, the differential coding consists in carrying out: $B'_n = B'_{n-1} \oplus B_n$ for $0 \leq n < N$, where $\oplus$ denotes the exclusive OR operation and $B'_{-1}$ denotes an initialization bit which also has to be transmitted ($B'_{-1}$ may be the last differentially encoded bit of the preceding frame). The associated decoding is then simply: $B_n = B'_{n-1} \oplus B'_n$ for $0 \leq n < N$. The differential coding does not introduce redundancy. The reason why it is used has to do with the problem of wave vector inversion posed by some modes of modulation, especially Gaussian minimum shift keying (GMSK) modulations. The tracking of the wave vector by the demodulator is difficult, particularly as regards the detection of its sign. When the amplitude of the wave vector drops by reason of a disturbance of the channel, such as a deep fade, one is often faced, after the disturbance, with an ambiguity with regard to the sign of the wave vector. The differential coding prevents the errors which may result from such sign inversions from propagating through the rest of the frame.

Whereas such differential coding makes it possible to overcome the problem of the sign of the decoded bits, it has the drawback of doubling the errors which affect the transmitted bits. If the propagation channel induces a localized error in a bit $B'_n$, this will result in an error in the bit $B_n$ and another one in the bit $B_{n+1}$ after decoding. Recourse to differential coding therefore increases the probability of transmission error in the bits of the frame.

An object of the present invention is to propose a transmission process which draws upon the advantages of differential coding whilst also achieving a reduction in the mean error rate rather than an increase. Another object is to be able to protect several classes of bit of the sequence to be transmitted whilst preserving relatively high efficiency in respect of the overall channel coding procedure.

SUMMARY OF THE INVENTION

The invention thus proposes a process for transmitting a first sequence of information bits, comprising the following steps executed by a sender device:

forming a second sequence of bits exhibiting redundancy based on the first sequence, in such a way that the second sequence includes at least one redundant subset consisting of L bits which represent M bits of the first sequence with $0 \leq M < L$;

forming a third sequence of bits by applying a differential coding of the form $d_n = c_n \oplus d_{f(n)}$ to the second sequence, where $c_n$ and $d_n$ denote the bits of rank n of the second and of the third sequence respectively, f(n) denotes an integer at most equal to n−1, and $\oplus$ denotes the exclusive OR operation; and sending a signal representing the bits of the third sequence in a specified order, and the following steps executed by a receiver device:

obtaining likelihood data $r_n$ based on the signal received from the sender device via a transmission channel, the sign of each likelihood data item $r_n$ representing an estimate, of reliability which increases with the absolute value of $r_n$, of the value of a respective bit $d_n$ of the third sequence;

calculating respective first estimates of the bits of the redundant subset, each first estimate of a bit $c_n$ of the redundant subset depending on the sign of $r_n \cdot r_{f(n)}$;

detecting the bits of the redundant subset having erroneous first estimates due to errors resulting from the transmission channel, by exploiting the redundancy present in the redundant subset;

for each bit $c_n$ of the redundant subset whose first estimate has been detected as erroneous, modifying the sign of that of the two likelihood data items $r_n$ and $r_{f(n)}$ which has the smaller absolute value;

obtaining respective second estimates of the bits of the second sequence, the second estimate of a bit $c_n$ of the second sequence depending on the sign of $r_n \cdot r_{f(n)}$; and obtaining estimates of the bits of the first sequence on the basis of the second estimates of the bits of the second sequence.

A likelihood data item $r_n$ received with an erroneous sign will generally have a small absolute value. When a means is available for ascertaining whether an estimate of a bit $c_n$ after differential decoding is incorrect, it is possible to estimate with fairly good reliability which of the two likelihood data items $r_n$ and $r_{f(n)}$ is the one which had an incorrect sign. In most cases it is the likelihood data item whose absolute value is the smaller. The redundancy present in the redundant subset actually enables incorrect bits to be identified, so that the associated likelihood data can be rectified and other bits not belonging to the redundant subset can be made to benefit from the rectification.

The bits thus benefiting from additional protection are those of the form $c_n'$ which do not belong to the redundant subset, and for which there is at least one bit cn belonging to the redundant subset and such that n'=f(n) or f(n')=n or f(n).

This additional protection provided by the differential coding is not accompanied by an increase in the bit rate required for transmission.

When $M \geq 1$, the redundant subset is composed of L bits produced by an error-correcting coding based on M bits of the first sequence during formation of the second sequence.

When M=0, the redundant subset is composed of L bits known to the receiver device. These known bits may in particular be synchronization bits.

In order to optimize the error correction capabilities, the structure of the second sequence and the function f are advantageously chosen in such a way as to maximize the number L', at most equal to L, of bits $c_n'$ of the second sequence not belonging to the redundant subset which are such that there are two bits $c_{n1}$ and $c_{n2}$ of the redundant subset with n'=f(n1) and f(n')=n2 or f(n2). Indeed, these bits $c_n'$ benefit from considerable protection given that they are estimated as a function of two likelihood data items which are correctable by virtue of the redundant subset.

Another aspect of the invention relates to a process for coding a first sequence of information bits, in which there is provided at least a first protection class for M bits of the first sequence and a second protection class for M' bits of the first sequence, M and M' denoting two integers at least equal to 1. This coding process comprises the following steps:

forming a second sequence of bits exhibiting redundancy from the first sequence, in such a way that the second sequence includes at least a first redundant subset consisting of L bits which represent the M bits of the first class of the first sequence with M<L, and a second subset consisting of L' bits which depend on the M' bits of the second class of the first sequence;

forming a third sequence of bits by applying a differential coding of the form $d_n = c_n \oplus d_{f(n)}$ to the second sequence, where $c_n$ and $d_n$ denote the bits of rank n of the second and of the third sequence respectively, f(n) denotes an integer at most equal to n−1, and $\oplus$ denotes the exclusive OR operation; and delivering a signal representing the bits of the third sequence in a specified order, the structure of the second sequence and the function f being chosen such that for each bit $c_n'$ belonging to the second subset of the second sequence, there is at least one bit $c_n$ belonging to the first subset of the second sequence and such that n'=f(n) or f(n')=n or f(n).

A third aspect of the present invention relates to a process for correcting a sequence of likelihood data $r_n$ obtained from a signal received from a sender device via a transmission channel, the sign of each likelihood data item $r_n$ representing an estimate, of reliability which increases with the absolute value of $r_n$, of the value of a respective bit $d_n$ of a coded sequence of bits resulting from a differential coding of a second sequence of bits by the sender device, the second sequence of bits including at least one redundant subset consisting of L bits which represent M information bits to be communicated with $0 \leq M<L$. With the differential coding being of the form $d_n = c_n \oplus d_{f(n)}$, $c_n$ and $d_n$ denoting the bits of rank n of the second sequence and of the coded sequence respectively, f(n) denoting an integer at most equal to n−1, and $\oplus$ denoting the exclusive OR operation, the correction process includes the following steps:

calculating respective first estimates of the bits of the redundant subset, each first estimate of a bit $c_n$ of said subset depending on the sign of $r_n \cdot r_{f(n)}$;

detecting the bits of the redundant subset having erroneous first estimates due to errors resulting from the transmission channel, by exploiting the redundancy present in the redundant subset; and for each bit $c_n$ of the redundant subset whose first estimate has been detected as erroneous, modifying the sign of that of the two likelihood data items $r_n$ and $r_{f(n)}$ which has the smaller absolute value.

DETAILED DESCRIPTION OF THE INVENTION

Figure 1:
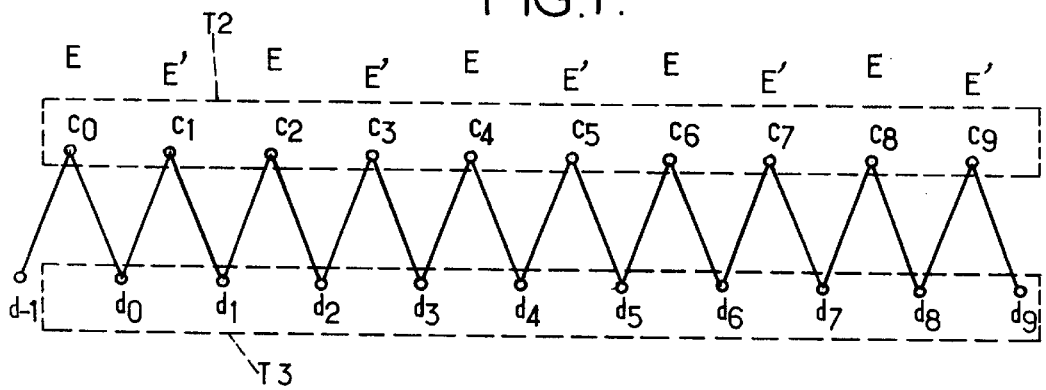
FIGS. 1 to 6 are diagrams illustrating various modes of differential coding which can be used in a process according to the invention.

FIG. 1 shows a sequence T2 of bits $c_0, c_1, \ldots$ formed from a sequence T1 (not represented in FIG. 1) of information bits to be transmitted $a_0, a_1, \ldots$ Here, each sequence T1, T2 is regarded as being composed of a given number of bits, the sequence, or frame, T2 exhibiting redundancy with respect to the sequence, or frame, T1 and therefore having a larger number of bits N than that K of the frame T1. In the simplified example considered here, the length N of the frame T2 is 10, the frame T1 having for example a length K=8. The frame T2 is assumed to include a redundant subset E consisting of L=5 bits $c_0$, $c_2$, $c_4$, $c_6$ and $c_8$, the L'=5 other bits of the frame constituting a subset E'.

The differential coding transforms the frame T2 into a sequence or frame T3 having the same number of bits N. The differential coding illustrated by the slanting lines in FIG. 1 is simply $d_n = c_n \oplus d_{n-1}$, that is to say that with the notation used earlier, f is the function f(n)=n−1. With the frames T3 being sent in succession, the initialization bit $d_{-1}$ is for example the last bit of the preceding frame T3.

Given that the bits of the subsets E and E' appear alternately in the frame T2, each bit $d_n$ of the frame T3 enters into the coding of a bit of the redundant subset E, namely the bit $c_{n+(n \bmod 2)}$. At the receiver device, the first estimate of this bit $c_{n+(n\ modulo\ 2)}$ will be correctable by exploiting the redundancy present in the subset E, which will make it possible in the event of correction to invert the estimate of the bit $d_n$ of the third frame, this inversion making it possible subsequently also to correct the estimate of the bit $c_{n+1-(n\ modulo\ 2)}$ belonging to the subset E'.

For each frame T3, the receiver device obtains a signal consisting of N real values or softbits $r_0, r_1, \ldots, r_{N-1}$ of the form $r_n = A_n(1-2d_n) + B_n$ where $A_n$ is the relative energy level of the signal received (in certain cases, the sign of $A_n$ is not known a priori) and $B_n$ is a noise sample. The values $r_n$ may be regarded as likelihood data associated with the bits $d_n$, given that it may be readily shown, for a channel with additive white Gaussian noise, that $r_n$ is proportional to $\ln[\Pr\{d_n=0|r_n\}/\Pr\{d_n=1|r_n\}]$ where $\Pr\{d_n=i|r_n\}$ denotes the probability that $d_n=i$ given that the value $r_n$ has been received. Stated otherwise, the sign of $r_n$ constitutes an estimate of the value of the bit $d_n$ whilst the absolute value of $r_n$ is a measure of the reliability of this estimate.

On account of the differential coding used, the receiver device can calculate first estimates $\hat{c}_n$ of the bits $c_n = d_n \oplus d_{f(n)}$ of the frame T2 as a function of the sign $\text{sgn}(r_n \cdot r_{f(n)}) = \pm 1$ of $r_n \cdot r_{f(n)}$ and optionally of the absolute values of $r_n$ and $r_{f(n)}$. These first estimates may be hard decisions, for example $\hat{c}_n = \text{sgn}(r_n \cdot r_{f(n)})$ (i.e. $\hat{c}_n = 1 - 2c_n$ in the absence of transmission errors) or soft decisions of the form $\hat{c}_n = \text{sgn}(r_n \cdot r_{f(n)}) \cdot g(|r_n|, |r_{f(n)}|)$ where g is a function which measures the reliability of the estimate, for example $g(x,y) = xy$. It is noted that, by virtue of the differential coding, any ambiguity in the sign of the energy levels $A_n$ does not affect the estimates $\hat{c}_n$. If exploitation of the redundancy provided in the subset E shows that the first estimate $\hat{c}_n$ of a bit $c_n$ of the subset E is erroneous, it is because the sign of $r_n$ or that of $r_{f(n)}$ is incorrect. The sign of that of the two data items $r_n$, $r_{f(n)}$ which is regarded as the less reliable, that is to say which has the smaller absolute value, is then inverted. Insofar as this data item whose sign has been inverted enters into the differential decoding of another bit of the frame T2 (or several), this latter bit will also be able to benefit from the correction made during a second differential decoding of the likelihood data.

If it is assumed that correction of the first estimates of the bits of the subset E yields results which are certain, it is possible to evaluate the probability of error in the sign of a likelihood data item $r_n$ entering into the differential decoding of a bit of the subset E:

$$Pr_{err}(r_n) = \frac{1}{2} Erfc\left(\sqrt{\frac{2Eb}{N_0}}\right) \quad (1)$$

where Erfc denotes the error function and $Eb/N_0$ denotes the signal-to-noise ratio.

E' denotes the subset with cardinal $L' \leq \min(L, N-L)$ of the frame T2, this subset being composed of the bits $c_n'$ not belonging to the subset E and such that two bits $c_{n1}$ and $c_{n2}$ of the redundant subset E satisfy $n' = f(n1)$ and $f(n') = n2$ or $f(n2)$. These bits $c_n'$ benefit from double protection given that the two associated likelihood data items $r_n'$ and $r_{f(n')}$ are correctable. It follows from relation (1) that the probability of error in a bit of the subset E' is:

$$Pr_{err}(c_n') \approx Erfc\left(\sqrt{\frac{2Eb}{N_0}}\right) \quad (2)$$

This probability $P_{err}(c_n')$ is substantially less than that obtained when differential coding is not used before sending.

E" denotes the subset with cardinal $L'' \leq N-L-L'$ of the frame T2, which subset is composed of the bits $c_{n''}$ which are such that there exists one and only one bit $c_n$ of the redundant subset E satisfying $n'' = f(n)$ or $f(n'') = n$ or $f(n)$. These bits $c_{n''}$ benefit from single protection. It follows from relation (1) that the probability of error in a bit of the subset E" is:

$$Pr_{err}(c_{n''}) \approx \frac{1}{2}\left(Erfc\left(\sqrt{\frac{Eb}{N_0}}\right) + Erfc\left(\sqrt{\frac{2Eb}{N_0}}\right)\right) \quad (3)$$

This probability $P_{err}(c_{n''})$ is of the same order as that obtained when differential coding is not used before sending.

E''' denotes the subset with cardinal L''' of the frame T2, which subset is composed of the bits $c_{perm\ (n''')}$ belonging neither to E, nor to E', nor to E". These bits do not benefit from protection by way of the differential coding. The associated error probability $$Pr_{err}(c_{n'''}) \approx Erfc\left(\sqrt{\frac{Eb}{N_0}}\right) \quad (4)$$

shows a degradation of 3 dB in the binary error rate as compared with the case in which differential coding is not used. In general, it will be possible to choose a structure of the frame T2, and a function f for which the subset E''' is empty (L''' = 0).

The structure of the frame T2 and the function f are preferably chosen in such a way as to maximize the cardinal L' of the subset E'. Ideally, the subset E' comprises all the bits of the frame T2 not belonging to the redundant subset E, as in the case of FIG. 1. This condition can be satisfied when $L \geq N/2$.

It is seen that, in the example considered in FIG. 1, all the bits of the frame T2 benefit from protection against transmission errors, although the redundancy is applied only to the subset E. The differential coding has therefore been able to introduce specific protection for certain bits of the frame, without reducing the overall efficiency of the channel coding.

Correction of the sign of the likelihood data $r_n$, $r_{f(n)}$ associated with the bits $c_n$ of the redundant subset E can be accompanied by modification of the reliabilities of these data. For example, if the $\hat{c}_n$ denote the respective first estimates of the bits $c_n$ of the redundant subset and, if the $\hat{c}'_n$ denote these same estimates after correction performed on the basis of the redundancy present in the subset E (with $\hat{c}'_n = c_n = 0$ or 1 in the absence of errors), it is possible to transform the likelihood data $r_n$ according to the relations:

$$r'_n = [r_n + r_{f(n)} \cdot (1 - 2\hat{c}'_n)]/\sqrt{2} \quad (5)$$

and $$r'_{f(n)} = r'_n \cdot (1 - 2\hat{c}'_n) \quad (6)$$

These relations (5) and (6) effect the necessary sign modification when $\text{sgn}(\hat{c}_n) \neq 1 - 2\hat{c}'_n$. Furthermore, they adjust the reliabilities $|r'_n|$ and $|r'_{f(n)}|$, with $|r'_n| = |r'_{f(n)}|$, this being of interest when the processing operations applied to the likelihood data involve soft decision procedures. Thus, if a likelihood data item (for example $r_n$) whose sign has been modified was initially relatively reliable ($|r_n|$ relatively large), the absolute value of the other likelihood data item is generally fairly similar ($|r_{f(n)}| > |r_n|$), and relations (5) and (6) produce relatively small reliabilities $|r'_n|$ and $|r'_{f(n)}|$, which accounts for the fact that the probability that modification of the sign is justified a priori is only slightly greater than 50%. If, on the other hand, the sign of $r_n$ is to be modified while $|r_n| \ll |r_{f(n)}|$, modification of the sign is very likely justified, and relations (5) and (6) assign relatively high reliabilities to the modified data $r'_n$ and $r'_{f(n)}$. This adjustment of the reliabilities $|r'_n|$ and $|r'_{f(n)}|$ also intervenes with regard to those bits $c_n$ of the redundant subset E for which the correction procedure reveals no error.

As indicated previously, the bits of the subset E may be bits known to the receiver, such as synchronization bits. The synchronization bits appear in each of the successive frames, so that an error affecting one of these known synchronization bits can be rectified, for example by virtue of the fact that the synchronization is already partly carried out by the analysis of the preceding frames. Formation of the second frame T2 by the sender device then includes the appending to the frame T1 of the synchronization bits and their distributing among the bits of the frame T1. If an interleaving of the bits of the frame T1 is necessary, it can be performed before appending the synchronization bits.

The redundancy present in the subset E can also stem from an error-correcting coding implemented during formation of the frame T2 from the frame T1. Thus, in the example illustrated in FIG. 2, the subset E of the bits of even rank of frame T2 is composed of L=5 bits which depend only on M=3 bits of frame T1 of the information bits to be transmitted. In this example, frame T1 is composed of K=8 information bits, of which one class CL1={$a_0$, $a_1$, $a_2$} is coded with redundancy in the subset E. Frame T1 includes a second class CL2 consisting of the M'=5 other bits $a_3$ to $a_7$ which are reproduced without redundancy in the subset E' (L'=M'). It will be observed, however, that the subset E' could also include some redundancy (that is to say L'>M'). In the example represented in FIG. 2, the formation of frame T2 from frame T1 is performed in two steps. The first step consists in appending two redundancy bits to the bits of class CL1 (in a systematic or non-systematic manner) so as to compile the redundant subset E at the beginning of a frame T1' of N=10 bits $b_n$. The other five bits of the frame T1' are the bits of class CL2, shifted by two positions. If the differential coding illustrated in FIG. 1 were simply applied to the frame T1', only the bit $b_5$ of the subset E' would benefit from some protection (via the bit $d_4$). To optimize the correction capabilities, a permutation is applied to the bits of the frame T1', suitable for establishing the desired alternating of the bits of the subsets E and E'. In the example represented in FIG. 2, this permutation is $c_n = b_{perm(n)}$ with perm(n)=n/2 if n is even and perm(n)=(n+9)/2 if n is odd (0≦n≦9). The frame T2 thus obtained can then be differentially coded in the same way as in FIG. 1 to obtain the frame T3.

If an interleaving of the bits is necessary, for example to take into account a Rayleigh channel, this interleaving can be performed when passing from frame T1' to frame T2. Indeed, interleaving is nothing other than a permutation of bits. The interleaving produces some mixing between the bits, but a priori this mixing is insufficient to ensure the alternating of the bits of the subsets E and E' needed to optimize the correction capabilities. Thus, the permutation defined by a conventional interleaving will have to be altered locally in order to disperse the bits of the subsets E and E' properly without reintroducing correlations between the probabilities of errors in neighbouring bits.

In a case in which the interleaving extends over several frames T1', the frame T2 is understood to be the segment of the interleaved binary sequence which includes all the bits of a frame T1'. The successive frames T2 can in particular exhibit mutual overlaps if diagonal interleaving is used.

It will be observed that it would be possible for the frame T2 not to be produced in explicit form at the level of the coder. Thus, the differential coding could be carried out directly on the basis of the frame T1' according to $d_n = b_{perm(n)} \oplus d_{f(n)}$ where perm is the aforesaid permutation over the integers 0 to N−1 (i.e. ensuring the alternating of the bits of the subsets E and E' and if appropriate an interleaving).

Figure 2:
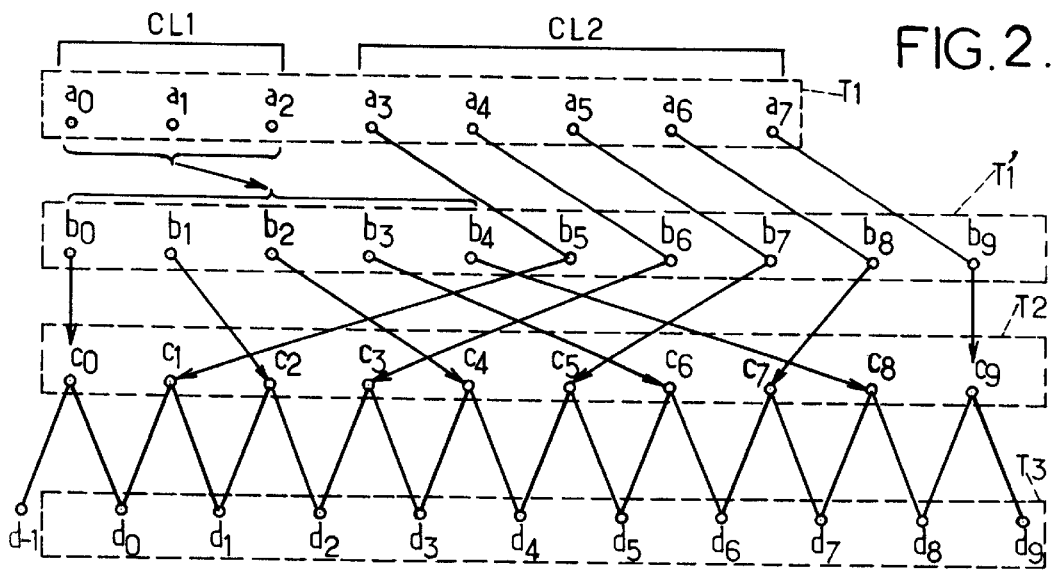

In the particular cases of FIGS. 1 and 2, the function f used in the differential coding is the function f(n)=n−1. This function is suitable when the number L of bits of the redundant subset E is at least equal to half the length N of the frames T2 and T3, provided that a suitable structure is adopted for the frame T2 (or an appropriate permutation perm is adopted). Each of the bits of the frame T2 then belongs either to the redundant subset E or to the subset E'.

Figure 3:
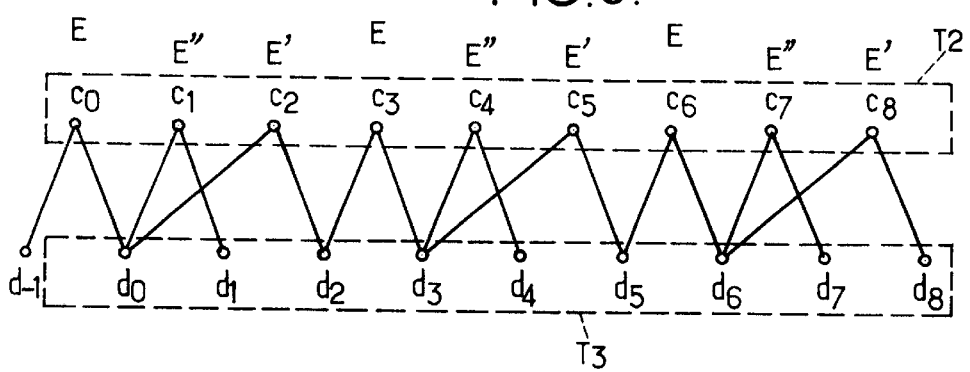

However, if L<N/2, this condition is no longer satisfied since the cardinal L' of E' cannot exceed that L of E. It is then judicious to modify the function f so as to maximize the cardinal of E'. FIG. 3 thus illustrates a case in which the redundant subset E is composed of L=N/3 bits of rank 3i, for i=0,1, . . . In this case the cardinal L' is maximized with the function f(3i)=3i−1, f(3i+1)=3i, f(3i+2)=3i for i=0,1, . . . The bits of rank 3i+2 make up the subset E' of the doubly protected bits. The bits of rank 3i+1 constitute the subset E" with cardinal L"=L'=L=N/3: it will be possible to correct the likelihood data item $r_{3i}$, but not the likelihood data item $r_{3i+1}$. In the example of FIG. 3, the frame T1 of the information bits to be transmitted can be decomposed into three classes CL1, CL2, CL3 having respectively M<L, M'≦L' and M"≦L" bits and which define the bits of the subsets E, E' and E" respectively. The bits of these three classes have different levels of protection.

Figure 4:
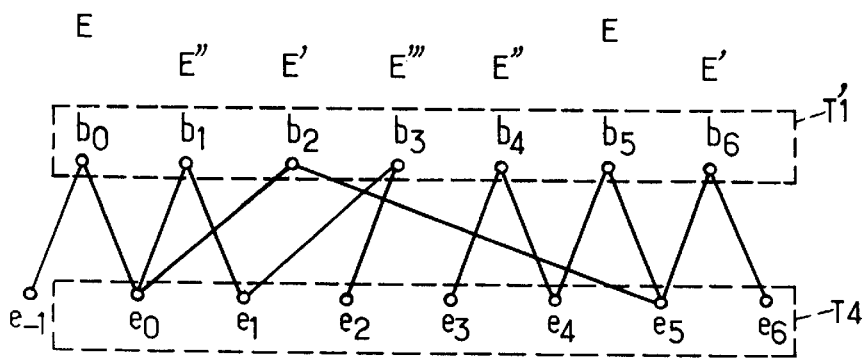
Figure 5:
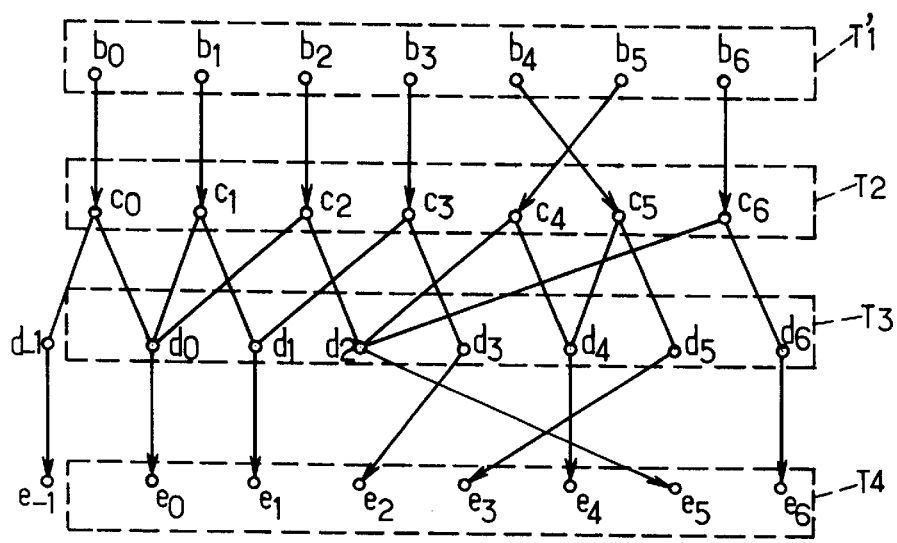

It is noted that it would be possible for the order in which the bits $d_n$ of the frame T3 are sent not to be the order present at the output of the differential coder. The frame T3 could thus be reordered before sending so as to form a send frame T4=($e_0, e_1, \ldots, e_{N-1}$) with $e_{perm'(n)} = d_n$ for 0≦n<N, perm' denoting a permutation over the integers 0 to N−1. In particular, an interleaving could be performed on the differentially coded frame. In such a case, if $s_0, s_1, \ldots, s_{N-1}$ denote the likelihood data obtained by the receiver device with regard to the bits $e_0, e_1, \ldots, e_{N-1}$, the likelihood data $r_0, r_1, \ldots, r_{N-1}$ corresponding to the bits $d_0, d_1, \ldots, d_{N-1}$ of frame T3, which are used for the differential decoding, are given by $r_n = s_{perm'(n)}$. In general, the differential coding procedure may be viewed as a graph which associates two distinct bits of the frame sent T4 with each bit of a frame T1' exhibiting redundancy, this graph containing no closed loop. For example, the transformation T1'→T4 represented in FIG. 4 can be decomposed into $e_{perm'(n)} = d_n$ with $d_n = b_{perm(n)} \oplus d_{f(n)}$ where perm, perm' and f are given by Table I, as FIG. 5 shows. It is noted that the illustrative example of FIGS. 4 and 5 is not optimal since E'"≠∅. Furthermore, the bit $b_2$ will be sensitive to an inversion (not correctable) of the wave vector occurring between the bits $e_0$ and $e_5$. As a general rule, it is not interesting that two overly distant bits of the frame sent encode a bit of the frame T1' or T2 when the problem of the wave vector inversion may arise.

| n | 0 | 1 | 2 | 3 | 4 | 5 | 6 |
|---|---|---|---|---|---|---|---|
| perm(n) | 0 | 1 | 2 | 3 | 5 | 4 | 6 |
| perm'(n) | 0 | 1 | 5 | 2 | 4 | 3 | 6 |
| f(n) | −1 | 0 | 0 | 1 | 2 | 4 | 2 |

TABLE I

It is further noted that the process according to the invention is perfectly compatible with the scrambling processes conventionally used in radio communications. Scrambling consists in inverting some of the bits so as to obtain a quasi-random distribution of 0s and 1s at the sending end. This is carried out by subjecting the sequence of bits to be sent to an exclusive OR operation with a binary sequence in which the 1 bits indicate the positions of the bits to be inverted, the same operation being carried out by the receiver for descrambling. Within the context of the invention, scrambling can be performed before differential coding (when forming the frame T2) or after differential coding (when passing from frame T3 to frame T4). Each bit $e_j$ of the frame sent T4 should be representative of a bit $d_n$ of the frame T3, with optionally j≠n and optionally inversions at positions known to the sender and to the receiver.

Figure 6:
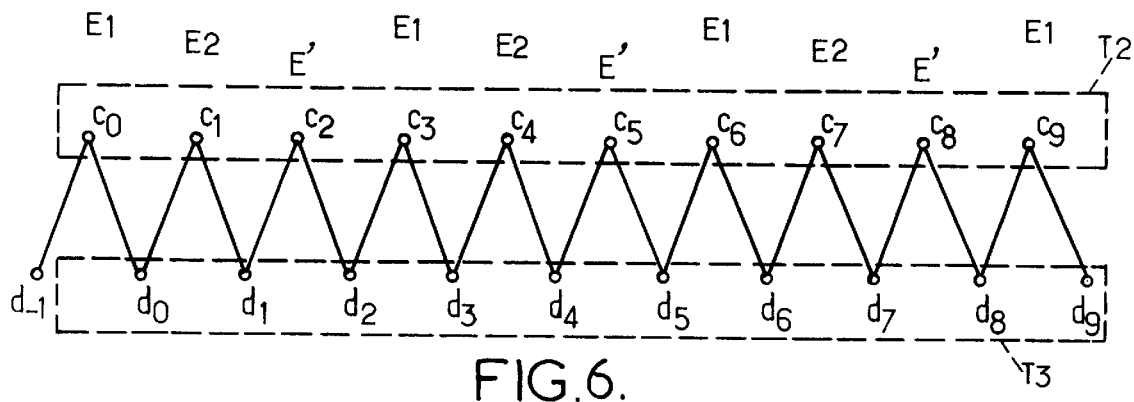

In the examples described with reference to FIGS. 1 to 5, the frame T2 includes a single redundant subset E affording protection which the differential coding makes it possible to extend in some measure to other bits of the frame T2. However, the invention makes it possible to provide for a number Q larger than 1 of such redundant subsets $E_1, \ldots, E_Q$. Each subset $E_q$ (1≤q≤Q) is composed of $L_q$ bits dependent on $M_q$ bits of the frame T1, with $0 \leq M_q < L_q < N$. FIG. 6 thus illustrates a case providing for Q=2 redundant subsets $E_1=\{c_0c_3,c_6,c_9\}$ and $E_2=\{c_1,c_4,c_7\}$ in a frame T2 of length N=10. Correction of the likelihood data $r_n$ can then be a procedure with Q stages (or fewer), each stage including, for one of the sets $E_q$:

calculation of first estimates $\hat{c}_n$ of the bits of $E_q$ as a function of the sign of $r_{n \cdot rf(n)}$ (and optionally of $|r_n|$ and $|r_{f(n)}|$);

detection of those of the first estimates $\hat{c}_n$ of the bits of $E_q$ which are erroneous, by exploiting the redundancy present in $E_q$ so as to correct any errors in the first estimates $\hat{c}_n$; and inversion of the sign of each likelihood data item $r_n$ such that $c_n$ has been detected as erroneous and $|r_n|<|r_{f(n)}|$ and of each likelihood data item $r_{f(n)}$ such that $\hat{c}_n$ has been detected as erroneous and $|r_{f(n)}|<|r_n|$.

In the example of FIG. 6, the first stage relating to the subset $E_1$ makes it possible to correct the data items $r_0$, $r_2$, $r_3$, $r_5$, $r_6$, $r_8$ and $r_9$. Let us assume for example that the redundant code used to obtain the bits of the subset $E_2$ allows the correction of one error only. Let us also assume that the signs of the data items $r_4$ and $r_6$ are erroneous at the receiving end. It will be possible to correct the data item $r_6$ during the first correction stage and the data item $r_4$ during the second correction stage, whereas such a double correction would not have been possible if it had been sought to decode the subset $E_2$ right from the first stage. In this case the invention makes it possible to improve the correction capabilities attaching to the subset(s) $E_q$ with q>1. The protection of the bits of the subset $E'=\{c_2,c_5,c_8\}$ is thereby also enhanced.

Figure 7:
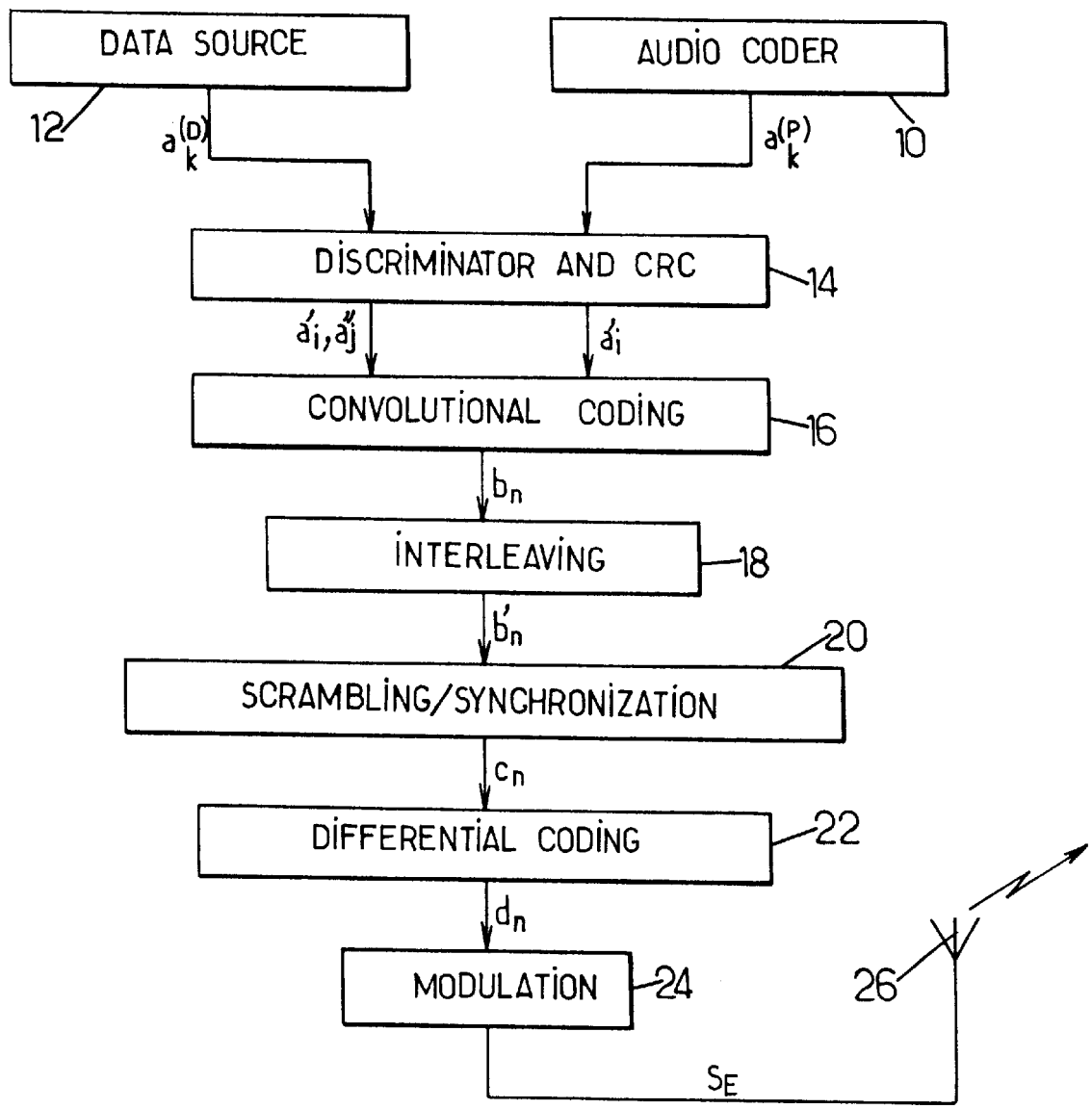
FIG. 7 is a schematic illustrating various steps of an illustrative coding process according to the invention.
Figure 8:
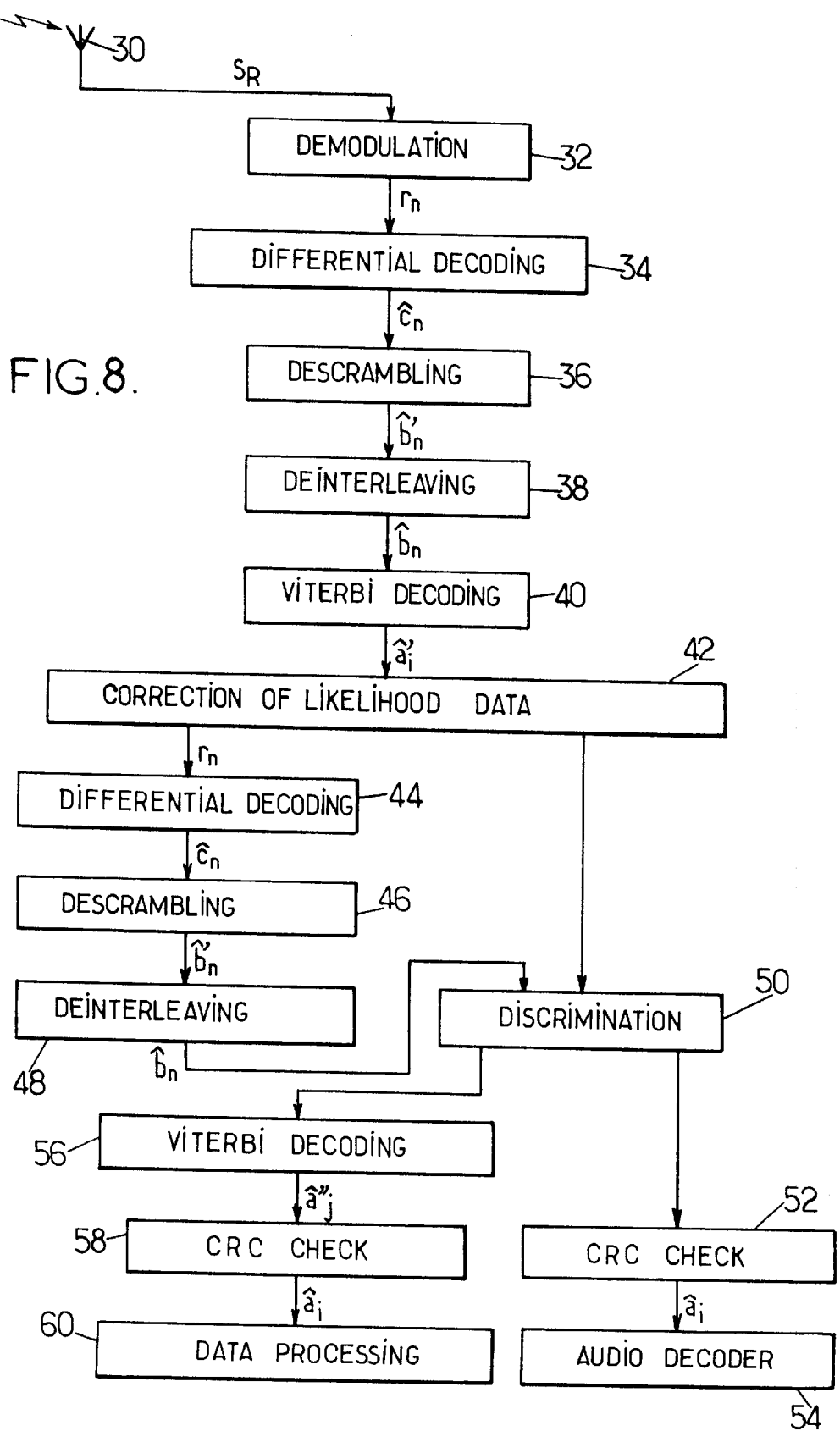
FIG. 8 is a schematic showing various steps of a decoding process corresponding to the coding process of FIG. 7.

The invention will now be illustrated by a particular example of a radio link allowing the transmission of data and sound between a sender and a receiver. The length of the transmitted frames is 160 bits which includes 8 synchronization bits in this example. FIGS. 7 and 8 are general schematics of the sender and receiver devices used.

The sender device comprises an audio coder 10 delivering sound frames T1 of $K^{(P)}=120$ bits $a_0^{(P)}, \ldots, a_{119}^{(P)}$, the first $M^{(P)}=20$ of which $a_0^{(P)}, \ldots, a_{19}^{(P)}$ are assigned to a protection class $CL1^{(P)}$, the next $M'^{(P)}=52$ of which $a_{20}^{(P)}, \ldots, a_{71}^{(P)}$ are assigned to a protection class $CL2^{(P)}$, and the last $M''^{(P)}=48$ of which $a_{72}^{(P)}, \ldots, a_{119}^{(P)}$ are assigned to a protection class $CL3^{(P)}$. The classes $CL1^{(P)}$, $CL2^{(P)}$ and $CL3^{(P)}$ correspond to decreasing levels of protection. The sender device moreover comprises a data source 12 delivering data frames of $K^{(D)}=66$ bits $a_0^{(D)}, \ldots, a_{65}^{(D)}$ the first $M^{(D)}=23$ of which $a_0^{(D)}, \ldots, a_{22}^{(D)}$ are assigned to a protection class $CL1^{(D)}$, the next $M'^{(D)}=23$ of which $a_{23}^{(D)}, \ldots, a_{45}^{(D)}$ are assigned to a protection class $CL2^{(D)}$, and the last $M''^{(D)}=20$ of which $a_{46}^{(D)}, \ldots, a_{65}^{(D)}$ are assigned to a protection class $CL3^{(D)}$. The classes $CL1^{(D)}$, $CL2^{(D)}$ and $CL3^{(D)}$ correspond to decreasing levels of protection.

A module 14 effects a sound/data discrimination and introduces a cyclic redundancy checksum (CRC) for error detection purposes. For a sound frame emanating from the coder 10, the module 14 defines bits $a'_i$ (-2≤i≤25) by:

$a'_0=0$ (sound/data discrimination bit);

$a'_{i+1}=a_i^{(P)}$ for 0≤i≤19 (class $CL1^{(P)}$);

$a'_{21}$, $a'_{22}$ and $a'_{23}$ are CRC bits such that the polynomial $a'_0 Z_{23}+a'_1 Z^{22}+ \ldots +a'_{22}Z+a'_{23}$ is a multiple of $1+Z+Z_3$;

$a'_{-2}=a'_{-1}=a'_{24}=a'_{25}=0$ for the initialization of the convolutional coding.

For a data frame emanating from the source 12, the module 14 defines bits $a'_i$ (-2≤i≤25) and $a''_j$ (-2≤j≤49) by the following successive steps:

$a'_0=1$ (sound/data discrimination bit);

$a'_{i+1}=a_i^{(D)}$ for 0≤i≤65;

$a'_{67}, \ldots, a'_{71}$ are CRC bits such that the polynomial $a'_0 Z_{71}+a'_1 Z_{70}+ \ldots +a'_{70}Z+a'_{71}$ is a multiple of $1+Z_2+Z_5$;

$a''_j=a'_{j+24}$ for 0≤j≤47 (classes $CL2^{(D)}$ and $CL3^{(D)}$);

$a'_{-2}=a'_{-1}=a'_{24}=a'_{25}=a''_{-2}=a''_{-1}=a''_{48}=a''_{49}=0$ for the initialization of the convolutional codings.

The module 14 is followed by a module 16 which performs the redundancy coding, this being a convolutional coding CC(2,1,3) in the example considered. The module 16 defines a frame T1' of N=152 bits $b_0, b_1, \ldots, b_{151}$, the bits $b_0$ to $b_{51}$ being given by:

$b_{2i}=a'_i \oplus a'_{i-1} \oplus a'_{i-2}$ for 0≤i≤25;

$b_{2i+1}=a'_i \oplus a'_{i-2}$ for 0≤i≤25, the bits $b_{52}$ to $b_{151}$ for a sound frame ($a'_0=0$) being given by $b_n=a_{n-32}^{(P)}$ for 52≤n≤151 (no redundancy for the classes $CL2^{(P)}$ and $CL3^{(P)}$), and the bits $b_{52}$ to $b_{151}$ for a data frame ($a'0=1$) being obtained by the same convolutional coding CC(2,1,3):

$b_{2j+52}=a''_{j-1} \oplus a''_{j-2}$ for 0≤j≤49;

$b_{2j+53}=a''_j \oplus a''_{j-2}$ for 0≤j≤49.

On output from the convolutional coding module 16, the bits $b_0$ to $b_{51}$ constitute the redundant subset labelled E previously (L=52) and represent the bits of the class $CL1^{(P)}$ or $CL1^{(D)}$ of the original frame. The bits b will be reordered before differential coding so that the bits $b_{52}$ to $b_{103}$ dependent on the bits of the class $CL2^{(P)}$ or $CL2^{(D)}$ constitute the subset labelled E' (L'=L=52). Bits $b_{104}$ to $b_{151}$ constitute the subset labelled E'' (L''=48). These bits of E'' depend on the $M''^{(P)}=L''$ bits of class $CL3^{(P)}$ in the case of the sound frames.

The module 16 is followed by a module 18 which effects an interleaving so as to make the error probabilities due to fading uniform. In the example considered here, the interleaving performed by the module 18 furthermore ensures the distribution of the bits enabling the cardinal L' of the subset E' to be maximized. The interleaving consists in carrying out $b'_n=b_{tab\_intr(n)}$ for 0≤n≤151 where tab_intr(n) denotes the (n+1)th value of an appropriate interleaving table such as for example:

tab_intr = [55 0 56 8 64 16 112 72 24 120 80 32 128 88 40
136 96 48 144 60 4 108 68 12 116 76 20 124 84 28 132 92 36
140 100 44 148 52 2 106 58 10 114 66 18 122 74 26 130 82 34

```
138 90 42 146 98 50 110 62 6 118 70 14 126 78 22 134 86 30
142 94 38 150 102 46 105 54 1 57 9 65 17 113 73 25 121 81 33
129 89 41 137 97 49 145 61 5 109 69 13 117 77 21 125 85 29
133 93 37 141 101 45 149 53 3 107 59 11 115 67 19 123 75 27
131 83 35 139 91 43 147 99 51 111 63 7 119 71 15 127 79 23
135 87 31 143 95 39 151 103 47 104]
```

In the above table tab__intr, the bold entries indicate the bits of the redundant subset E and the underlined entries indicate the bits of the subset E', the other entries indicating the bits of the subset E".

A module 20 scrambles the bits $b'_n$ delivered by the interleaving module 18 and adds the 8 synchronization bits thereto. The scrambling uses for example a sequence S(k) of period 127 defined by S(k)=0 for $0 \leq k \leq 6$ and S(k)=S(k-1) $\oplus$ S(k-7) for $7 \leq k < 127$. The scrambled frame T2 is formed by the module 20 according to: $c_n = b'_n \oplus$ S(scr+n) for $0 \leq n \leq 151$, the scrambling parameter used scr being known to the sender and to the receiver. The synchronization bits $c_{-8}, c_{-7}, \ldots, c_{-1}$ placed ahead of the frame T2 are fixed, for example 01100010.

The differential coding is performed by a module 22. The synchronization bits are not differentially coded: $d_i = c_i$ for $-8 \leq i \leq -1$. The bit $d_{-1} = c_{-1} = 0$ then serves as initialization bit for the differential coding. The expression for the differential coding in the example considered is $d_n = c_n \oplus d_{f(n)}$ with f(n)=n-1-tab__dif(n) where tab__dif is a binary table constructed so as to obtain the desired distribution of the bits of the subsets E, E' and E":

```
tab__dif=[000000010010010010010010010010010010010010010100
100100100100100100100100100000001001001001001001001001001
100100100100100100100100100100100100100100]
```

The sequence composed of the 8 synchronization bits $d_{-8}, \ldots, d_{-1}$ and of the N=152 bits of the frame T3 $d_0, \ldots, d_{151}$ is forwarded to a modulation stage 24 which produces the radio signal $S_E$ sent by means of the antenna 26. The modulation used is of GMSK ("Gaussian Minimum Shift Keying") type in the example considered.

FIG. 8 shows a receiver device associated with the sender device of FIG. 7. The radio signal $S_R$ received on the antenna 30 is firstly demodulated by a stage 32. The demodulation stage 32 effects, in particular, the synchronization of the frames by means of the 8 synchronization bits. The demodulation stage 32 produces the likelihood data $r_{-8}, \ldots, r_{-1}, r_0, r_1, \ldots, r_{151}$ associated with the bits $d_{-8}, \ldots, d_{-1}, d_0, d_1, \ldots, d_{151}$.

A module 34 performs the differential decoding. In the example considered, this is a hard decision decoding: $\hat{c}_n = [1 - \text{sgn}(r_n \cdot r_{f(n)})]/2$ for $0 \leq n \leq 151$, with the function f defined earlier. The $\hat{c}_n$ ($0 \leq n \leq 151$) are first estimates of the bits $c_n$ of the frame T2. The descrambling is performed by a module 36 according to: $\hat{b}'_n = \hat{c}_n \oplus$ S(scr+n) for $0 \leq n \leq 151$. The de-interleaving is performed by a module 38 according to $\hat{b}_{tab\_intr(n)} = \hat{b}'_n$ for $0 \leq n \leq 151$.

An error-correcting decoder 40 decodes the L=52 estimates $\hat{b}_0, \hat{b}_1, \ldots, \hat{b}_{51}$ of the bits $b_0, b_1, \ldots, b_{51}$ pertaining to the redundant subset E. This decoding is for example carried out according to the hard-decision Viterbi algorithm. Estimates $\hat{a}'_i$ of the bits $a'_i$ for $0 \leq i \leq 23$ are thus obtained.

A module denoted by the reference 42 in FIG. 8 next performs (any) correction of the likelihood data $r_n$. The module 42 firstly recodes the bits $\hat{a}'_0, \ldots, \hat{a}'_{23}$ according to the convolutional code CC(2,1,3) used by the coder 16 of the sender device, with $\hat{a}'_{-2} = \hat{a}'_{-1} = \hat{a}'_{24} = \hat{a}'_{25} = 0$:

$$\hat{B}_{2i} = \hat{a}'_i \oplus \hat{a}'_{i-1} \oplus \hat{a}'_{i-2} \text{ for } 0 \leq i \leq 25;$$

$$\hat{B}_{2i+1} = \hat{a}'_i \oplus \hat{a}'_{i-2} \text{ for } 0 \leq i \leq 25.$$

The bits $\hat{B}_n$ ($0 \leq n \leq 51$) constitute the corrected estimates of the bits $b_n$ pertaining to the redundant subset E. It is noted that the $\hat{B}_n$ ($0 \leq n \leq 51$) could also be produced directly by the Viterbi trellis used by the decoder 40. The module 42 next detects the bits of the redundant subset E whose first estimates are erroneous. These are the bits $c_{tab\_intr(n)}$ such that $0 \leq n \leq 51$ and $\hat{b}_n \neq \hat{B}_n$. For each bit $c_m$ of the redundant subset E whose first estimate has been detected as erroneous, the module 42 inverts the sign of that of the two data items $r_m, r_{f(m)}$ which has the smaller absolute value. Based on the first estimates $\hat{b}_n$ supplied to the input of the decoder 40 and on the corresponding corrected estimates $\hat{B}_n$, the module 42 can thus execute the following instructions:

```
For n=0 to 51,
    if b̂ₙ≠B̂ₙ
        m=tab__intr(n)
        m'=m-1-tab__dif(m)
        If |rₘ|>|rₘ'|
            rₘ'=-rₘ'
        Else
            rₘ=-rₘ
        End If
    End If
End For
```

If the convolutional decoder were to operate on the basis of soft decisions, the module 42 would advantageously use the previously stated relations (5) and (6) to modify the absolute values and, if appropriate, the signs of the likelihood data $r_n$ associated with the bits of the redundant subset E. This could be performed by executing the following instructions (noting that $\hat{c}'_{tab\_intr(n)} = \hat{B}_n \oplus$ S(scr+tab__intr(n))):

```
For     n=0 to 51,
        m=tab__intr(n)
        m'=m-1-tab__dif(m)
        s=1-2[B̂ₙ ⊕ S(scr+m)]
        rₘ=(rₘ+s.rₘ')√2
        rₘ' = s.rₘ
End for
```

If at least one likelihood data item $r_n$ has been corrected by the module 42, there is again undertaken a differential decoding ($\hat{c}_n = [1 - \text{sgn}(r_n \cdot r_{f(n)})]/2$ for $0 \leq n \leq 151$), a descrambling ($\hat{b}'_n = \hat{c}_n \oplus$ S(scr,n) for $0 \leq n \leq 151$) and a de-interleaving ($\hat{b}_{tab\_intr(n)} = \hat{b}'_n$ for $0 \leq n \leq 151$) by means of respective modules 44, 46, 48 which are identical to the modules 34, 36, 38 but operate on the corrected data $r_n$.

The rest of the operations performed by the receiver device depends on the nature of the frame considered (sound or data). A module 50 performs this discrimination on the basis of the bit $â'_0$ supplied by the decoder 40.

In the case of a sound frame ($â'_0=0$), a module 52 checks the validity of the CRC bits $â'_{21}$, $â'_{22}$ and $â'_{23}$ by verifying that the polynomial $â'_0 Z_{23} + \ldots + â'_{22} Z + â'_{23}$ is indeed a multiple of $1+Z+Z_3$. In the event of an error, the frame is indicated as being incorrect to the audio decoder 54. Otherwise, the audio decoder 54 receives the $K_{(P)}=120$ estimates $â_0, \ldots, â_{119}$ of the information bits $a_{0(P)}, \ldots, a_{119(P)}$ of the frame T1, given by:

$$\hat{a}_i = \hat{a}'_{i+1} \text{ for } 0 \leq i \leq 19;$$

and $$\hat{a}_i = \hat{b}_{i+32} \text{ for } 20 \leq i \leq 119,$$

supplied by the module 38 or, if at least one data item $r_n$ has been corrected, by the module 48.

In the case of a data frame ($â'_0=1$), an error-correcting decoding is applied to the bits $\hat{b}_{52}, \ldots, \hat{b}_{151}$ (supplied by the module 38 or, if at least one data item $r_n$ has been corrected, by the module 48) by a decoder 56 also operating according to the Viterbi algorithm. Estimates $â''_j$ of the bits $a''_j$ for $0 \leq j \leq 47$ are thus obtained. A module 58 checks the validity of the CRC bits $â''_{43}, \ldots, â''_{47}$ by verifying that the polynomial $â'_0 Z_{71} + \ldots + â'_{23} Z_{48} + â''_0 Z_{47} + \ldots + â''_{47}$ is indeed a multiple of $1+Z_2+Z_5$. In the event of an error, the frame is indicated as being incorrect to the data processing module 60. Otherwise, the data processing module 60 receives the $K_{(D)}=66$ estimates $â_0, \ldots, â_{65}$ of the information bits $â_0^{(D)}, \ldots, â_{65}^{(D)}$ of the frame T1, given by:

$$\hat{a}_i = \hat{a}'_{i+1} \text{ for } 0 \leq i \leq 22;$$

and $$\hat{a}_i = \hat{a}''_{i-23} \text{ for } 23 \leq i \leq 65.$$

I claim:

1. Process for transmitting a first sequence of information bits, comprising the following steps executed by a sender device:

forming a second sequence of bits exhibiting redundancy based on the first sequence, in such a way that the second sequence includes at least one redundant subset consisting of L bits which represent M bits of the first sequence with $0 \leq M < L$;

forming a third sequence of bits by applying a differential coding of the form $d_n = c_n \oplus d_{f(n)}$ to the second sequence, where $c_n$ and $d_n$ denote the bits of rank n of the second and of the third sequence respectively, f(n) denotes an integer at most equal to n−1, and $\oplus$ denotes the exclusive OR operation; and sending a signal representing the bits of the third sequence in a specified order, and the following steps executed by a receiver device:

obtaining likelihood data $r_n$ based on a signal received from the sender device via a transmission channel, the sign of each likelihood data item $r_n$ representing an estimate, having a reliability which increases with the absolute value of $r_n$, of the value of a respective bit $d_n$ of the third sequence;

calculating respective first estimates of the bits of the redundant subset, each first estimate of a bit $c_n$ of the redundant subset depending on the sign of $r_n \cdot r_{f(n)}$;

detecting the bits of the redundant subset having erroneous first estimates due to errors resulting from the transmission channel, by exploiting the redundancy present in the redundant subset;

for each bit $c_n$ of the redundant subset whose first estimate has been detected as erroneous, modifying the sign of that of the two likelihood data items $r_n$ and $r_{f(n)}$ which has the smaller absolute value;

obtaining respective second estimates of the bits of the second sequence, the second estimate of a bit $c_n$ of the second sequence depending on the sign of $r_n \cdot r_{f(n)}$; and obtaining estimates of the bits of the first sequence on the basis of the second estimates of the bits of the second sequence.

2. Process according to claim 1, wherein the redundant subset is composed of L bits produced by an error-correcting coding based on M bits of the first sequence, with $M \geq 1$.

3. Process according to claim 1, wherein the redundant subset is composed of L bits known to the receiver device.

4. Process according to claim 1, wherein the structure of the second sequence and the function f are chosen in such a way as to maximize the number L', at most equal to L, of bits $c_n a'$ of the second sequence not belonging to the redundant subset which are such that there are two bits $c_{n1}$ and $c_{n2}$ of the redundant subset with n'=f(n1) and f(n')=n2 or f(n2).

5. Process according to claim 1, wherein the second sequence includes a number Q larger than 1 of redundant subsets $E_1, \ldots, E_Q$, the redundant subset $E_q$ consisting of $L_q$ bits which represent $M_q$ bits of the first sequence with $0 \leq M_q < L_q$ for $1 \leq q \leq Q$.

6. Process according to claim 5, wherein, before obtaining said second estimates of the bits of the second sequence, the receiver device executes the succession of the following steps for several of the redundant subsets $E_q$:

calculating respective first estimates of the bits of the redundant subset $E_q$, each first estimate of a bit $c_n$ of the subset $E_q$ depending on the sign of $r_n \cdot r_{f(n)}$;

detecting the bits of the redundant subset $E_q$ having erroneous first estimates due to errors resulting from the transmission channel, by exploiting the redundancy present in the subset $E_q$;

for each bit $c_n$ of the redundant subset $E_q$ whose first estimate has been detected as erroneous, modifying of the sign of that of the two likelihood data items $r_n$ and $r_{f(n)}$ which has the smaller absolute value.

7. Process according to claim 1, wherein, after having calculated the first estimates of the bits of the redundant subset, the receiver device modifies, for each bit $c_n$ of the redundant subset, the likelihood data items $r_n$ and $r_{f(n)}$ as a function of a corrected estimate of the bit $c_n$ obtained on the basis of the first estimates by exploiting the redundancy present in the redundant subset, said modification affecting the absolute values of the likelihood data items $r_n$ and $r_{f(n)}$ and, when the corrected estimate of the bit $c_n$ of the redundant subset is not in accord with said first estimate of the bit $c_n$, the sign of that of the two likelihood data items $r_n$ and $r_{f(n)}$ which has the smaller absolute value.

8. Process according to claim 7, wherein, after modification of the likelihood data items $r_n$ and $r_{f(n)}$ associated with a bit $c_n$ of the redundant subset, the two likelihood data items $r_n$ and $r_{f(n)}$ have the same absolute value.

9. Process according to claim 8, wherein said modification of the likelihood data items $r_n$ and $r_{f(n)}$ associated with a bit $c_n$ of the redundant subset (E) is of the form:

$$r'_n = [r_n + r_{f(n)} \cdot (1 - 2\hat{c}_n)] / \sqrt{2}$$

and

-continued $$r'_{f(n)} = r'_n \cdot (1 - 2\hat{c}'_n)$$

where $r'_n$ and $r'_{f(n)}$ denote the likelihood data items $r_n$ and $r_{f(n)}$ after modification and $\hat{c}'_n$ denotes the corrected estimate, which is such that $\hat{c}'_n = 0$ or $1$, of the bit $c_n$ of the redundant subset.

10. Process for coding a first sequence of information bits, wherein there is provided at least a first protection class for M bits of the first sequence and a second protection class for M' bits of the first sequence, M and M' denoting two integers at least equal to 1, said process comprising the steps of:

forming a second sequence of bits exhibiting redundancy from the first sequence, in such a way that the second sequence includes at least a first redundant subset consisting of L bits which represent the M bits of the first class of the first sequence with M<L, and a second subset consisting of L' bits which depend on the M' bits of the second class of the first sequence;

forming a third sequence of bits by applying a differential coding of the form $d_n = c_n \oplus d_{f(n)}$ to the second sequence, where $c_n$ and $d_n$ denote the bits of rank n of the second and of the third sequence respectively, f(n) denotes an integer at most equal to n−1, and $\oplus$ denotes the exclusive OR operation; and delivering a signal representing the bits of the third sequence in a specified order, and wherein the structure of the second sequence and the function f are chosen such that for each bit $c_n'$ belonging to the second subset of the second sequence, there is at least one bit $c_n$ belonging to the first subset of the second sequence and such that n'=f(n) or f(n')=n or f(n).

11. Process according to claim 10, wherein the number L' of bits of the second subset of the second sequence is at most equal to the number L of bits of the first subset of the second sequence, and wherein the structure of the second sequence and the function f are chosen such that for each bit $c_n'$ belonging to the second subset of the second sequence, there are two bits $c_{n1}$ and $c_{n2}$ belonging to the first subset of the second sequence and such that n'=f(n1) and f(n')=n2 or f(n2).

12. Process according to claim 11, wherein there is provided a third protection class for M" bits of the first sequence, M" denoting an integer at least equal to 1, wherein the second sequence includes a third subset consisting of L" bits which depend on the M" bits of the third class of the first sequence, and wherein the structure of the second sequence and the function f are chosen such that for each bit $c_n'$ belonging to the third subset of the second sequence, there is a single bit $c_n$ belonging to the first subset of the second sequence and such that n"=f(n) or f(n") =n or f(n).

13. Process for correcting a sequence of likelihood data $r_n$ obtained from a signal received from a sender device via a transmission channel, the sign of each likelihood data item $r_n$ representing an estimate, having a reliability which increases with the absolute value of $r_n$, of a value of a respective bit $d_n$ of a coded sequence of bits resulting from a differential coding of a second sequence of bits by the sender device, the second sequence of bits including at least one redundant subset consisting of L bits which represent M information bits to be communicated with $0 \leq M < L$, wherein said differential coding is of the form $d_n = c_n \oplus d_{f(n)}$, $c_n$ and $d_n$ denoting the bits of rank n of the second sequence and of the coded sequence respectively, f(n) denoting an integer at most equal to n−1, and $\oplus$ denoting the exclusive OR operation, the correction process including the steps of:

calculating respective first estimates of the bits of the redundant subset, each first estimate of a bit $c_n$ of the redundant subset depending on the sign of $r_n \cdot r_{f(n)}$;

detecting the bits of the redundant subset having erroneous first estimates due to errors resulting from the transmission channel, by exploiting the redundancy present in the redundant subset; and for each bit $c_n$ of the redundant subset whose first estimate has been detected as erroneous, modifying the sign of that of the two likelihood data items $r_n$ and $r_{f(n)}$ which has the smaller absolute value.

14. Process according to claim 13, wherein, after the calculation of the first estimates of the bits of the redundant subset, the likelihood data items $r_n$ and $r_{f(n)}$ are modified, for each bit $c_n$ of the redundant subset, as a function of a corrected estimate of the bit $c_n$ obtained on the basis of the first estimates by exploiting the redundancy present in the redundant subset, said modification affecting the absolute values of the likelihood data items $r_n$ and $r_{f(n)}$ and, when the corrected estimate of the bit $c_n$ of the redundant subset is not in accord with said first estimate of the bit $c_n$, the sign of that of the two likelihood data items $r_n$ and $r_{f(n)}$ which has the smaller absolute value.

15. Process according to claim 14, wherein, after modification of the likelihood data items $r_n$ and $r_{f(n)}$ associated with a bit $c_n$ of the redundant subset, the two likelihood data items $r_n$ and $r_{f(n)}$ have the same absolute value.

16. Process according to claim 15, wherein said modification of the likelihood data $r_n$ and $r_{f(n)}$ associated with a bit $c_n$ of the redundant subset is of the form:

$$r'_n = [r_n + r_{f(n)} \cdot (1 - 2\hat{c}'_n)] / \sqrt{2}$$

and $$r'_{f(n)} = r'_n \cdot (1 - 2\hat{c}'_n)$$

where $r'_n$ and $r'_{f(n)}$ denote the likelihood data items $r_n$ and $r_{f(n)}$ after modification and $\hat{c}'_n$ denotes the corrected estimate, which is such that $\hat{c}'_n = 0$ or $1$, of the bit $c_n$ of the redundant subset.

* * * * *